United States Patent [19]

Shiota et al.

[11] Patent Number: 5,773,178
[45] Date of Patent: Jun. 30, 1998

[54] PROCESS FOR PRODUCING A PATTERNED ANISOTROPIC POLYMERIC FILM

[75] Inventors: Atsushi Shiota, Tsukuba, Japan; Christopher K. Ober, Ithaca, N.Y.

[73] Assignees: Japan Synthetic Rubber Co, Ltd., Tokyo, Japan; Cornell Research Foundation, Inc., Ithaca, N.Y.

[21] Appl. No.: 713,875

[22] Filed: Sep. 13, 1996

[51] Int. Cl.$^6$ .................................................. G03C 5/16
[52] U.S. Cl. .......................................................... 430/20
[58] Field of Search .................... 430/20, 321; 349/127, 349/129, 92, 93, 94

[56] References Cited

FOREIGN PATENT DOCUMENTS

| 0331233 | 9/1989 | European Pat. Off. . |
| 5-181403 | 7/1993 | Japan . |
| 8-21915 | 1/1996 | Japan . |

OTHER PUBLICATIONS

R.A.M. Hikmet et al, "Effect of the Orientation of the Ester Bonds on the Properties of Three Isomeric Isomeric Liquid Crystal Diacrylates Before and After Polymerization", Macromolecules 1995, 28, 3313–3327.

Atsushi Shiota et al, "Synthesis and Curing of Novel LC Twin Epoxy Monomers for Liquid Crystal Thermosets", Journal of Polymer Science: Part A: Polymer Chemistry, vol. 34, 1291–1303 (1996).

Hilmar Korner et al, "Orientation–on–Demand Thin Films: Curing of Liquid Crystalline Networks in AC Electric Fields", Science, vol. 272, 252–255 (12 Apr. 1996).

Morton H. Litt et al, "Crosslinked Liquid Crystal Polymers from Liquid Crystal Monomers: Synthesis and Mechanical Properties", Journal of Polymer Scient: Part A: Polymer Chemistry, vol. 31, 183–191 (1993).

Chandra Sekhar, "Liquid Crystals", $2^{nd}$ Edition, Cambridge University Press (1992), pp. 176–195.

*Primary Examiner*—John A. McPherson
*Attorney, Agent, or Firm*—Oblon, Spivak, McClelland, Maier & Neustadt, P.C.

[57] ABSTRACT

A process for producing a patterned anisotropic polymeric film using an ac field and photopolymerizable liquid crystalline monomers.

8 Claims, 3 Drawing Sheets $n = 1 - 10$
$p + q = n$
$p >= 0, q >= 0$

Fn—Sp—M—Sp—Fn    Fn—M—Fn    Fn—M—Sp—M—Fn
*FIG. 1*
M:
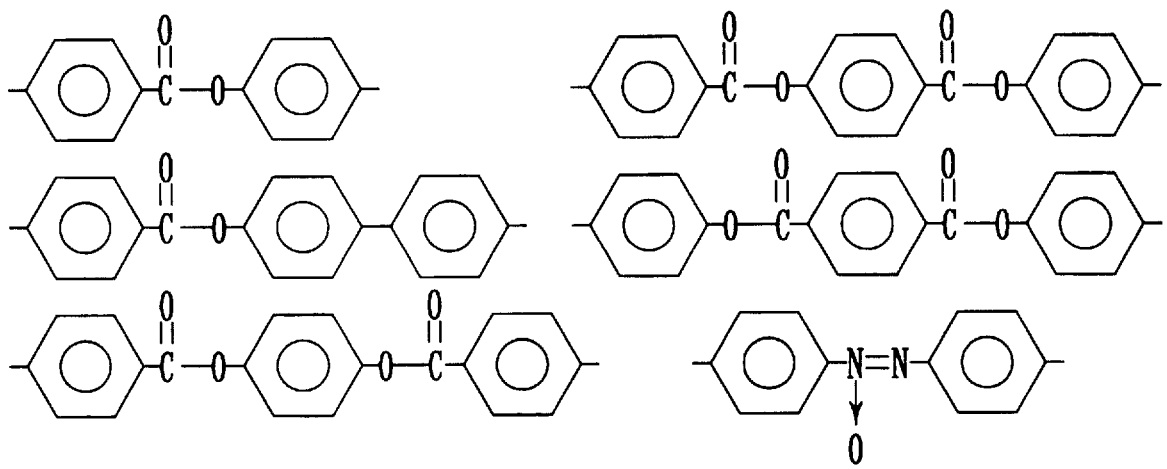
*FIG. 2*
Fn:
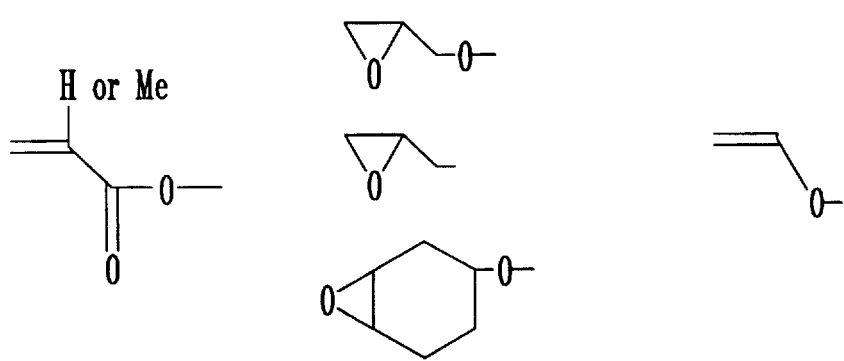
*FIG. 3*

Sp:

n = 1 - 10
p + q = n
p >= 0, q >= 0

PROCESS FOR PRODUCING A PATTERNED ANISOTROPIC POLYMERIC FILM

BACKGROUND OF THE INVENTION

1. Field of the Invention

The present invention relates to polymer films having varying (patterned) molecular orientations therein and to methods for their manufacture. In particular, the invention polymer films comprise polymerized mesogens which have been selectively oriented and polymerized so as to provide a pattern of varying molecular orientation within the film. Selective orientation of all unpolymerized mesogens within the film followed by bulk rapid polymerization, or bulk orientation followed by pattern-wise rapid polymerization, may be used to produce such films.

2. Discussion of the Background

Growing interest in optical technologies such as liquid crystal displays, optical ICs, and optical wave guides has created a strong demand for technology capable of manipulating molecular orientation. In the past decade, liquid crystalline materials have satisfied this demand because liquid crystal materials respond to an external field such as an electric field, a magnetic field, and sometimes a mechanical field. As a result, liquid crystal materials are widely used as switching devices in liquid crystal displays.

In addition to switching, technologies to lock responses permanently are also demanded for substrate materials like optical filters, alignment layers for liquid crystal displays, and optical wave guides. Radiation cure technology is efficient to fix anisotropic responses from the view point of processability and fast reaction time.

JP-H8-21915 (Dinippon Ink) discloses a photopolymerizable liquid crystal composition which can be used as an optical material, display material or recording material. JP-H8-21915 also discloses a uniformly oriented optically anisotropic film (perpendicularly oriented to the electrode). This optically anisotropic film was produced by photopolymerization of a photopolymerizable liquid crystal composition under an external electric field. JP93-181403 (Asahi Glass) discloses a method to produce an optically anisotropic layered structure for holography. A photopolymerizable liquid crystalline monomer is cured by two coherent lights originating from different directions under an applied electric field. The orientation of the molecules was fixed by the polymerization only where the interference occurred.

The above technologies use liquid crystalline materials having a positive dipole anisotropy in order to obtain electric field response. For liquid crystal displays, liquid crystalline compounds having a positive dipole anisotropy are widely used because of the quick response and requirement of only low applied electric field. However, the liquid crystalline materials can only be aligned parallel to the electric field and perpendicular to the electrode when the electric field is applied.

In order to align liquid crystal molecules parallel to an electrode, treatment of the surface of the electrode is required. Usually, a rubbed polyimide surface is used for this purpose. Such surface alignment is effective only in the vicinity of the surface, however, and usually only extends to a thickness of 10 $\mu$m. Aligning molecules over a 100 $\mu$m thickness and beyond by this surface alignment technology is very difficult.

H. Kroner et al. (Science, 272(12) 252–255 1996) incorporated herein by reference, recently demonstrated that a dicyanate ester monomer having a negative dipole anisotropy could be oriented and polymerized in an ac electric field, and that the orientation of the molecules was controllable by changing the frequency of the field. While this technology offers the opportunity to manipulate molecular orientation for a robust network and align molecules over a 200 $\mu$m range parallel or perpendicular to a film substrate, the system is a thermoset and it is impossible to make any pattern of varying molecular orientation within the same film.

OBJECTS OF THE INVENTION

The present invention provides the technology to make a polymerized film comprising a pattern of varying molecular orientation. The film is useful for, e.g., an optical wave guide, as an alignment layer for a liquid crystal display, for stereo holography, optical switches, optical filters, optical fibers, optical disks, diffraction gratings, optical memories, optical couplers, optical arrays, etc.

DETAILED DESCRIPTION OF THE INVENTION

According to the present invention, polymer films having a pattern of varying molecular alignment (orientation) can be obtained using a photopolymerizable liquid crystalline compound or composition. The photopolymerizable liquid crystalline composition preferably contains at least 25 mol % based on 100 mol % of polymerizable monomers therein, of one or more difunctional or higher-functional photopolymerizable liquid crystalline monomers having a negative dipole anisotropy and, if desired, one or more photoinitiators. "Negative dipole anisotropy" means that the component of the dipole moment along the longitudinal (long) direction of the molecule (liquid crystal molecules are generally rod-shaped) is smaller than that along the lateral or transverse direction. Azoxybenzene, phenylbenzoate, and derivatives thereof are representative mesogenic groups having negative dipole anisotropy.

The general structure of the photopolymerizable liquid crystalline monomers of the present invention is as follows:

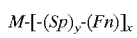

wherein M is a mesogenic group, Sp is a spacer, Fn is a photopolymerizable group, y=0 or 1 and x=1–6, preferably 2. y may vary from [Sp-Fn] group to [Sp-Fn] group when x is >1. Preferred monomers are shown in FIG. 1. In the above formula when x is 1 y is preferably 1.

BRIEF DESCRIPTION OF THE FIGURES

FIG. 1 shows the general structures of preferred photopolymerizable liquid crystalline monomers.

FIG. 2 shows representative structures of mesogenic groups M.

FIG. 3 shows preferable photopolymerizable functions Fn.

Figure 4:
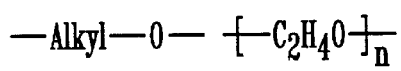
FIG. 4 shows preferred representative structures of flexible spacers Sp.
Figure 4:
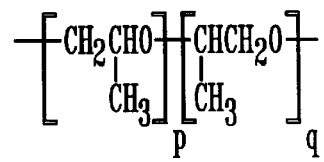

The invention photopolymerizable liquid crystalline monomer has at least one mesogenic group terminated with one, preferably two, and up to six or more, photopolymerizable functions attached via optional flexible spacers. Preferably the invention composition of monomer and initiator contains at least 25 mol % of monomers having at least two photopolymerizable groups based on 100 mol % monomer in the composition. Acryloyoxy, methacryloyoxy, oxyranylmethoxy, oxyranyl, 3,4 epoxycyclohexyloxy, and ethenyloxy are preferable photopolymerizable functions. Alkyl ($C_1$–$C_{12}$, preferably $C_2$–$C_6$), alkyloxy, oligoethyloxy and oligoisopropyloxy groups are preferable flexible spacers. Oligodimetylsilioxanes are also useful as the flexible spacer. Mesogens, spacers and photopolymerizable groups are known to those of ordinary skill in this art. Examples of other mesogens and spacers are found in the liquid crystals shown in *Liquid Crystals in Tabellen*, Vols. I and II, VEB Leipzig, 1974 and 1984, both incorporated herein by reference. Photopolymerizable groups are those groups capable of being polymerized by the action of radiation, preferably UV radiation, on the group itself and/or on a photopolymerization catalyst mixed with monomers having such groups.

The photopolymerizable liquid crystalline monomers of the invention should exhibit at least one liquid crystalline state between ambient temperature and 200° C., mostly because the photopolymerizable liquid crystalline composition is processed (photopolymerized) in the liquid crystalline state. The preferred liquid crystalline phase for photopolymerization is the nematic phase. Preferably the invention compositions contain 50–100 mol % of difunctional photopolymerizable liquid crystalline monomers.

Photopolymerizable liquid crystalline monomers useful herein have a negative dipole anisotropy and include those reported liquid crystalline diacrylates by Hikmet, R. A. M. et al. (Macromolecules 28 3313–3327, 1995), incorporated herein by reference, such as 4-[[6-[(1-oxo-2-propenyl) oxy] hexyl]oxy]benzoic acid 4-[[4-[[6-[(1-oxo-2-propenyl) oxy] hexyl]oxy]phenoxy]carbonyl]phenyl, 4-[[6-[(1-oxo-2-propenyl) oxy]hexyl]oxy]benzoic acid 1,4-phenylene ester, and 1,4-Benzenedicarboxylic acid, bis[4-[[6-[(1-oxo-2-propenyl) oxy]hexyl]oxy]phenyl] ester, those reported diepoxides by S. Jahromi et al. (Polymer, 35, 622–629, 1994), incorporated herein by reference, such as 4-[2-(oxranylmethoxy) ethoxy]benzoic acid 1,4-phenylene ester, those reported diepoxides by A. Shiota et al. (J. Polym. Sci.: Part A: Polym. Chem., 34, 1291–1303, 1996), incorporated herein by reference, such as 4-(Oxiranylmethoxy)benzoic acid 1,9-noanediylbis(oxy-4,1-phenylene) ester, and those reported divinylethers by R. A. M. Hikemet et al. (Polymer, 34, 1736–1740, 1993), incorporated herein by reference, such as 4-[[6-(ethenyloxy)hexyl]oxy]benzoic acid 1,4-phenlene ester. The liquid crystal monomers reported in JP-H8-21915, JP93-181403, *Science*, 272(12) 252–255, 1996 (Korner et al.) and U.S. Ser. No. 08/510,867, all incorporated herein by reference, may also be used.

The photopolymerizable liquid crystalline composition of the invention is a mixture of one or more photopolymerizable liquid crystalline monomers and, if desired, one or more photoinitiator. When the photopolymerizable functions are acryloyoxy or methacryloyoxy, radical photoinitiators such as benzophenone, acylphosphineoxide, and 1,1-dimethoxy-1-phenylacetophenone are preferred. When the photopolymerizable functions are oxyranylmethoxy, oxyranyl, 3,4-epoxycyclohexyloxy, or ethenyloxy cationic photoinitiators such as arylazonium tetrafluoroborate, diaryliodonium hexafluoroantimonate, triarylsulfonium hexafluorophosphate, are preferred. The concentration of the photoinitiator is usually 0.1–10 wt % based on total composition weight.

It is possible for the invention photopolymerizable liquid crystalline composition to contain at most 75 mole % of monofunctional photopolymerizable liquid crystalline monomers which possess a negative dipole anisotropy (compounds where x in the above formula is 1). This is due to the fact that as the invention photocured networks lose crosslink density with the copolymerization of a large amount of monofunctional monomers, it becomes difficult to retain the molecular orientation in the film produced due to thermal relaxation. It is also possible for the invention photopolymerizable liquid crystalline composition to comprise a certain amount of photopolymerizable non-liquid crystalline monomers as long as the photopolymerizable composition retains liquid crystallinity. Examples are methacrylic acid, vinyl chloride, etc.

The alignment and curing of the invention photopolymerizable liquid crystalline composition is preferably conducted on a substrate and, more preferably, in a liquid crystal cell. The liquid crystal cell may be composed of two electrodes, separators and the invention photopolymerizable liquid crystalline composition. An alignment layer on the electrodes is not required but may be present, whereas a conventional liquid crystal cell must have an alignment layer in order to switch the molecular direction of liquid crystalline compounds. A 10 $\mu$m–500 $\mu$m gap separated with an insulater between two electrodes is preferable. The photopolymerizable liquid crystalline composition is injected in the cell and fills the gap. At least one of the two electrodes should be transparent to the polymerization irradiation (like an indium tin oxide glass electrode (ITO electrode)) because the photopolymerizable liquid crystalline composition is preferably polymerized by light exposure through the transparent electrode.

The invention liquid crystalline monomers having negative dipole anisotropy can be aligned in a ac electric field. In addition, the orientation of the molecules can be controlled by changing the frequency of the applied field. There is a certain crossover frequency, usually inbetween 100 Hz and 10 kHz. Above the crossover frequency, the molecule is aligned normal to the director of the applied ac electric field. Below the crossover frequency the molecule is aligned parallel to the director of the applied ac electric field. This behavior is a characteristic of liquid crystalline materials having a negative dipole anisotropy. A liquid crystal molecule having a positive dipole anisotropy does not display such a switching behavior but is always aligned along the director of the applied electric field.

Figure 5:
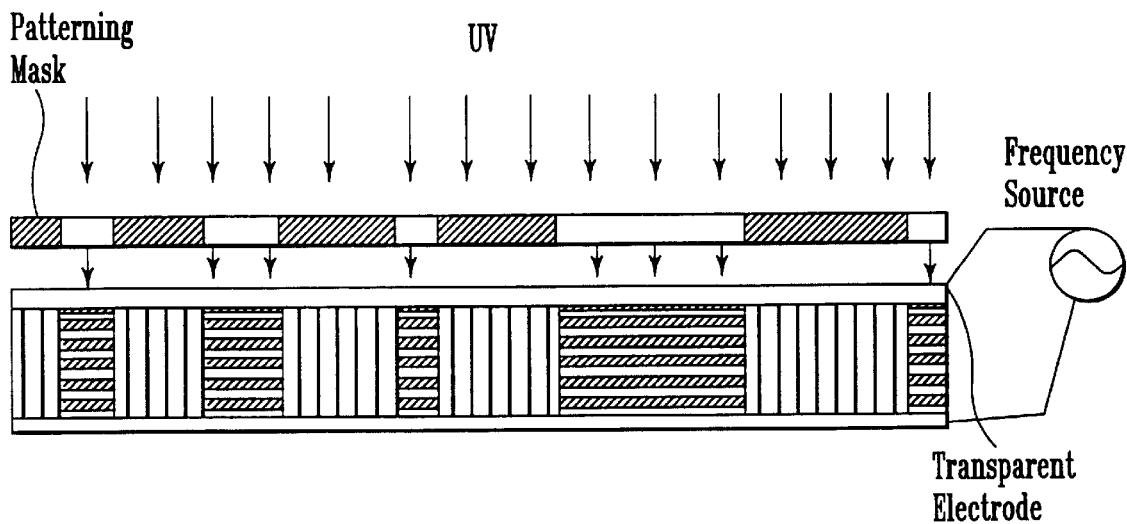
FIG. 5 shows a patterning method according to the invention.

The orientation of the invention photopolymerizable liquid crystalline composition under the influence of an ac electric field can be frozen in a network using a fast cure such as UV curing. This allows for the production of a film which has an anisotropic orientation either parallel to the electrode or perpendicular to the electrode, and when, e.g., UV exposure is carried out through a photomask the exposed parts of the composition are cured with the desired orientation. Subsequently, switching the frequency of the applied field to above or below the crossover frequency orients the uncured rest of the area of the composition in a different direction and additional UV exposure without photomask fixes the molecular orientation in a network. See FIG. 5. After first partial cure the entire film can be placed in a separate field-generating device oriented at any desired angle to orient the molecules at a second orientation before second cure. As many orientation/cure cycles as desired can be used. This pattern-wise irradiation allows for the construction of a pattern of essentially infinite varying molecular orientation in the same polymer film. Orientations perpendicular and parallel to the substrates (electrodes) are preferred. Moreover, since the anisotropic orientation is locked in through crosslinks provided by the difunctional and higher-functional monomers, a robust network film is provided which retains the frozen in orientations until the film is heated to a decomposition temperature. An anisotropic film obtained from a monofunctional liquid crystalline monomer having a positive dipole anisotropy typically cannot retain molecular orientation above the glass transition temperature because the polymer is a side chain-type liquid crystalline polymer. In the side chain type liquid crystalline polymer, thermal relaxation destroys the oriented structure.

It is convenient to carry out the invention alignment and cure process with the liquid crystal cell described above. The UV exposure should be conducted under temperature regulation in order to maintain a liquid crystalline state of the photopolymerizable liquid crystalline composition. Simultaneously, an ac electric field should be applied to the photopolymerizable liquid crystalline composition through the electrodes. The preferable amplitude of applied ac electric field is 0.5–10 V/mm below the crossover frequency, and 0.05–5 V/mm above the crossover frequency.

This difference is believed to come from the different orientation mechanism between the low frequency region and the high frequency region. Above the crossover frequency, the quickly alternating electric field can only be coupled with the lateral or transverse director of the dipole moment which is larger than the longitudinal director of the dipole moment of liquid crystalline molecules having negative dipole anisotropy. In a low amplitude applied field, the molecular alignment is stable because the coupling does not cause a rotation of the molecules. Above a certain threshold of the applied electric field (usually >1 V/mm), the liquid crystalline molecules begin to rotate on the longitudinal axis of the molecule. Consequently, the molecular alignment becomes worse due to the rotational motion of the molecules above the threshold.

On the other hand, below the crossover frequency, the alignment of the molecules becomes better as the amplitude of the applied electric field increases. This is due to a convection flow which occurs in a low frequency of the applied ac field. This behavior is called "electrohydrodynamic instability" (S. Chandrasekhar, Liquid Crystals 2nd edition, p177, Cambridge University Press, 1992). Once the convection occurs, the liquid crystalline molecule aligns along the convection flow. It is thought that accumulated charge, which dominates convection, is dispersed as the electric field is intensified, because the dielectric torque and elastic torque perturb the charge accumulation. Consequently, as a more intense applied electric field shrinks the size of the convection, there results an averaging of the homeotropic orientation of the molecules. However, even in a high electric field, the state is still dynamic with concurrently produced disorder spots. As discussed above, it has been found that the molecular orientation below the crossover frequency can be frozen in a network with a very quick cure reaction such as a UV cure technique even though it is believed that the molecules are dynamically moving. The degree of the orientation can be controlled by simply changing the amplitude of the applied electric field, allowing for essentially infinite varying orientations.

If the cure reaction occurs slowly the molecules construct a random network, or if the reaction occurs very slowly, the molecules are aligned even perpendicular to the electric field. This is because the crossover frequency shifts to lower frequency as the molecular weight increases. In this invention, a very quick cure reaction (photopolymerization) is required in order to freeze the parallel orientation to the applied ac electric field below the crossover frequency. Of course, if UV exposure is carried out without applying an electric field, one obtains a film portion which has no orientation. No orientation counts as an "orientation" herein. Thus, a film oriented and selectively photopolymerized and then photopolymerized in the absence of a field with unpolymerized monomer unoriented is within the scope of the invention.

Since liquid crystalline molecules possess anisotropic optical, electrical and mechanical properties this invention provides the technology to manipulate these properties in the same film without complicated steps. For example, as the liquid crystalline molecule has different refractive indices between its longitudinal direction and lateral direction, the invention can provide low refractive index lines in a high refractive index film. This kind of film is useful for optical wave guides, optical circuits, holographs and optical lenses. This materials also displays unique mechanical and electrical properties which are useful in various applications where other polymer films have been used.

The invention will now be further described with reference to non-limiting examples.

EXAMPLES

Thermal transition temperatures were obtained with a DuPont 950 differential scanning calorimeter (DSC) using a heating and cooling rate of 10° C./min. Liquid crystal mesophases were examined using a Nikon polarizing optical microscope (POM) OPTIPHOT2-POL at 100× and 200× magnification equipped with a Mettler FP-82HF hotstage and a Nikon FX-35DX 35 mm camera. Wide angle x-ray diffraction (WAXD) patterns were obtained with nickel filtered copper Ka radiation using an evacuated flat plate camera with pin hole collimator. The X-ray source was a Scintag generator operated at 45 kV and 40 mA. A nominal sample to film distance in the camera of 5 cm and 16.5 cm, and exposure times of 12 hours were typical. The ultraviolet light irradiation was carried out on a hot plate under temperature regulation using the UVEXS model SCU-110B as the ultraviolet light source. The intensity of the ultraviolet light was 230 mW/cm2 at 365 nm from a mercury short arc lamp operating at 100 W.

Example 1

4-[[6-[(1-oxo-2-propenyl)oxy]hexyl]oxy]benzoic acid methyl-1,4-phenylene ester [LCM-1] was synthesized by Hikmet's method (Hikmet, R. A. M. et al., Macromolecules 28 3313–3327, 1995), but methylhydroquinone was used instead hydroquinone. LCM-1 showed a nematic phase between 92° C. and 146° C. A photopolymerizable liquid crystalline composition (LCC-1) was made of 99 wt % of LCM-1 and 1 wt % radical photoinitiator 1,1-dimethoxy-1-phenylacetophenone "Irgagure 651" (available from Ciba Geigy). A liquid crystal cell with 75 μm spacing and 1 cm² effective area was made from two ITO glass electrodes without any rubbed alignment layer. LCC-1 was injected into the cell at 100° C.

Figure 6:
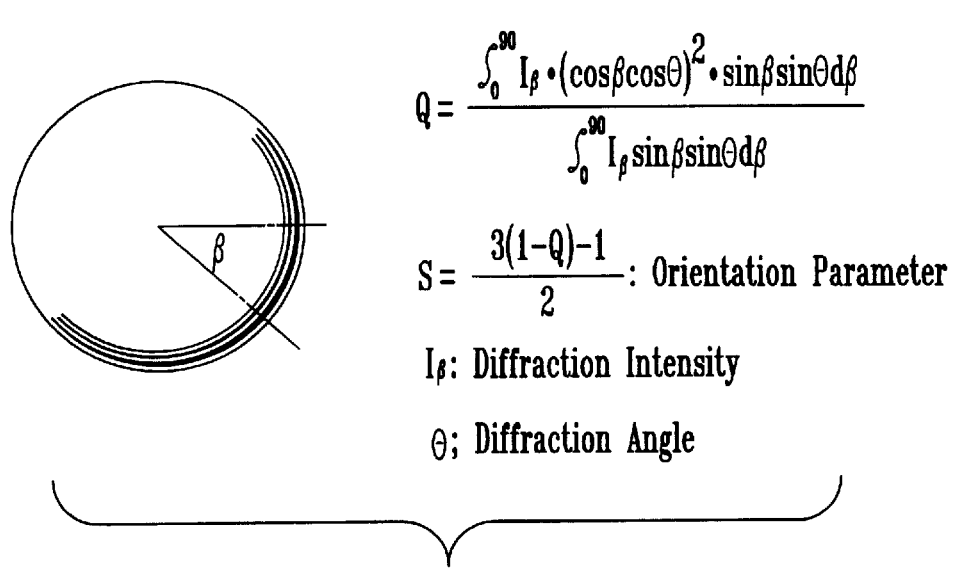
FIG. 6 shows the x-ray diffraction of LCC-1 of Example 1.

A ac potential of 200 Vrms at 10 Hz was applied to the liquid crystal cell. Subsequently, the cell was irradiated for 3 seconds by ultraviolet light so that LCC-1 was polymerized at 100° C. The cell comprising cured LCC-1 was observed using a cross polarizing optical microscopy (POM). The low birefringence from the cured LCC-1 showed that the molecules were oriented normal to the electrode surface. POM observation at 200° C. confirmed that LCC-1 retained the orientation at that temperature. The cured LCC-1 was peeled out of the electrode, and subjected to x-ray diffraction measurement. A perpendicular orientation to the electrode was confirmed by a x-ray diffraction pattern of edge-on side of the cured LCC-1. The orientation parameter S of 0.45 was calculated. See FIG. 6.

Example 2

A liquid crystal cell comprising LCM-1 and photopolymerization radical initiator was prepared in the same manner as Example 1. A ac potential of 125 Vrms at 5 kHz was applied to the liquid crystal cell. Subsequently, the cell was irradiated for 3 seconds by ultraviolet light at 100° C. so that LCC-1 was polymerized. The cell comprising cured LCC-1 was observed using a cross polarizing optical microscopy. The high birefringence from the cured LCC-1 showed that the molecules were oriented parallel to the electrode surface. The cured LCC-1 was peeled out of the electrode, and subjected to x-ray diffraction measurement. A parallel orientation to the electrode was confirmed by an x-ray diffraction pattern of edge-on side of the cured LCC-1. The orientation parameter was 0.52.

Example 3

A liquid crystal cell comprising the LCC-1 was prepared in the same manner of Example 1. Half the cell was masked with aluminum foil. Then, an ac potential of 125 Vrms at 5 kHz was applied to the liquid crystal cell. Subsequently, the cell was irradiated for 3 seconds by ultraviolet light at 100° C. so that exposed LCC-1 was polymerized. Subsequently, the aluminum foil was removed from the cell. Then, an ac potential of 200 Vrms at 10 Hz was applied to the liquid crystal cell. Subsequently, the cell was irradiated for 3 seconds by ultraviolet light so that remaining unpolymerized LCC-1 was polymerized. The cell was observed using a cross polarizing optical microscopy. The contrast of birefringence from the cured LCC-1 showed the molecule was oriented parallel to the electrode surface in half the cell and the molecule was aligned perpendicular to the electrode surface in the other half.

Example 4

4-[2-(oxranylmethoxy)ethoxy]benzoic acid 1,4-phenylene ester [LCM-2] was synthesized in the same manner described in J. Polym. Sci.: Part A: Polym. Chem., 34, 1291–1303, 1996 incorporated herein by reference. The LCM-2 showed a nematic phase in between 127° C. and 149° C. A photopolymerizable liquid crystalline composite (LCC-2) was made of 98.5 wt % of LCM-2 and 0.5 wt % a radical photoinitiator 1,1-dimethoxy-1-phenylacetophenone "Irgagure 651" and 1 wt % of a photocationic initiator diphenyliodonium hexafluoroarsenate. A liquid crystal cell with 75 μm spacers and 1 cm² effective area was made from two ITO glass electrode with rubbed polyimide alignment layer. LCC-2 was injected into the cell at 130° C. as quickly as possible then cooled. A half of the cell was masked with aluminum foil. Then, an ac potential of 125 Vrms at 5 kHz was applied to the liquid crystal cell. Once the cell was heated to 130° C. in order to melt the LCC-2 the cell was cooled to 110° C. Subsequently, the cell was irradiated for 5 seconds by ultraviolet light at 110° C. so that LCC-2 was polymerized. Afterward, the aluminum foil was removed from the cell. Then, an ac potential of 150 Vrms at 200 Hz was applied to the liquid crystal cell. Subsequently, the cell was irradiated for 5 seconds by ultraviolet so that unpolymerized now-exposed LCC-2 was polymerized. The cell comprising cured LCC-2 was observed using a cross polarizing optical microscopy. The contrast of birefringence from the cured LCC-2 showed that the molecules were oriented parallel to the electrode surface in half the area of the cell and the molecules were aligned perpendicular to the electrode surface in the other half. The cured LCC-2 was then peeled out of the electrode and divided into a part which was cured under the electric field of 10 kHz and a part which was cured under the electric field of 10 Hz. Parallel orientation to the electrode surface for the cured LCC-2 under the electric field of 10 kHz, and perpendicular orientation to the electrode surface for the cured LCC-2 under the electric field of 10 Hz, was confirmed by x-ray diffraction measurement.

Example 5

Liquid crystal cells comprising the LCC-1 were prepared in the same manner as in Example 4. In order to examine dependency of orientation parameters upon applied electric field, applied potential at 10 Hz was varied. An ac potential was applied to the liquid crystal cell. Subsequently, the cell was irradiated for 3 seconds by ultraviolet light at 100° C. so that LCC-1 was polymerized. The cured LCC-1 was peeled out of the electrode, and subjected to x-ray diffraction measurement.

Figure 7:
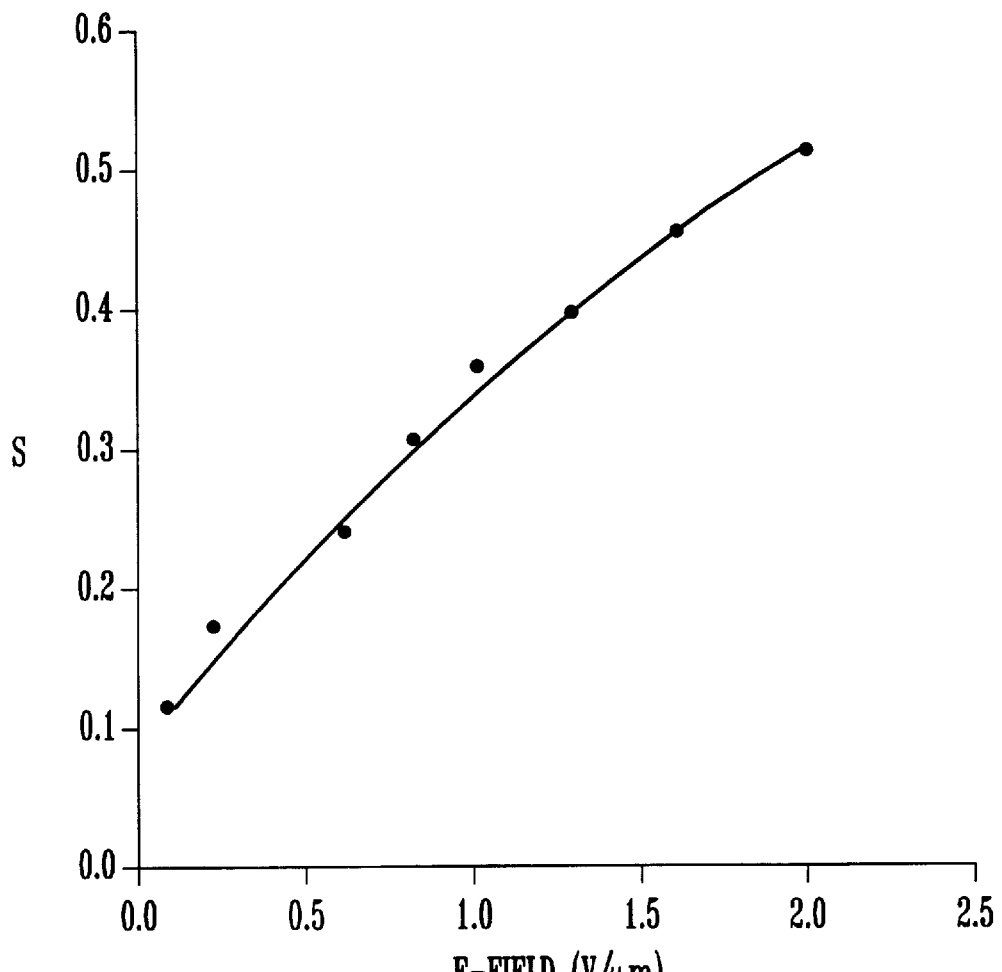
FIG. 7 shows orientation parameter vs. applied field for Example 5.

A perpendicular orientation to the electrode was confirmed by x-ray diffraction pattern measurement edge-on of LCC-1 and the orientation parameter was calculated. FIG. 7 shows that the orientation parameter for the perpendicular orientation to the electrode surface strongly depended upon the applied electric field at 10 Hz. The orientation parameter increased as the applied electric field increased.

Example 6

A liquid crystal cell with 25 μm spacers and 1 cm² effective area was made from two ITO glass electrodes with rubbed polyimide alignment layers. LCC-1 was injected into the cell at 100° C. A half part of the cell was masked with aluminum foil. Then, the cell was irradiated for 3 seconds by ultraviolet light at 100° C. without applying any electric field so that LCC-1 was polymerized. Subsequently, the aluminum foil was removed from the cell. Then, an ac potential of 200 Vrms at 10 Hz was applied to the liquid crystal cell. Subsequently, the cell was irradiated for 3 seconds by ultraviolet light so that thus far monomeric LCC-1 was polymerized. The cell comprising cured LCC-1 was observed using a cross polarizing optical microscopy. The contrast of birefringence from the cured LCC-1 showed that the molecules were oriented parallel to the electrode surface in half the area of the cell and that the molecules were aligned perpendicular to the electrode surface in the other half. The following x-ray diffraction measurement confirmed that parallel orientation to the electrode surface for the cured LCC-1 without an electric field (presumably due to the alignment layer), and perpendicular orientation to the electrode surface for the cured LCC-1 under the electric field of 10 Hz.

Comparative example 1

4,4-bis(3-hydroxypropyloxy)biphenyl diacrylate (CLCM-1) having a positive dipole anisotropy was synthesized by the method described by M. Litt et al. (J. Polym. Sci. : Part A: Polym. Chem., 31, 183–191, 1993). The CLCM-1 showed a nematic phase between 60° C. and 79° C. A photopolymerizable liquid crystalline composite (CLCC-1) was made of 99 wt % of CLCM-1 and 1 wt % a radical photoinitiator 1,1-dimethoxy-1-phenylacetophenone "Irgagure 651" (available from Ciba Geigy). A liquid crystal cell with 75 μm spacers and 1 cm² effective area was made from two ITO glass electrode without any rubbed alignment layer. The CLCC-1 was injected into the cell at 70° C.

A ac potential of 200 Vrms at 10 Hz was applied to the liquid crystal cell. Subsequently, the cell was irradiated for 5 seconds by ultraviolet light so that LCC-1 was polymerized at 70° C. The cell comprising cured CLCC-1 was observed using a cross polarizing optical microscope. The cured CLCC-1 was peeled out of the electrode, and subjected to x-ray diffraction measurement. According to the result of the x-ray diffraction measurement, the cured CLCC-1 was not oriented perpendicular to the electrode surface but slightly aligned parallel to the electrode surface. The orientation parameter S of 0.27 was obtained for the parallel orientation. Since CLCM-1 does not have a negative dipole anisotropy, perpendicular orientation to the electrode surface could not be obtained.

Comparative example 2

A polymerizable liquid crystalline composition (CLCC-2) was made of 1 mol parts of LCM-2 and 2 mol parts of diaminodiphenylmethane. A liquid crystal cell with 75 μm spacers and 1 cm² effective area was made from two ITO glass electrode without any rubbed alignment layer. The CLCC-2 was injected into the cell at 120° C. as quickly as possible then cooled. An ac potential of 200 Vrms at 10 Hz was applied to the liquid crystal cell. Subsequently, the cell was heated to 140° C. for 30 minutes so that CLCC-2 was polymerized. The cured CLCC-2 was peeled out of the electrode, and subjected to x-ray diffraction measurement. According to the result of the x-ray diffraction measurement, the cured CLCC-2 was not oriented perpendicular to the electrode surface but aligned parallel to the electrode surface. Also the cured CLCC-2 showed a smectic phase because a strong diffraction at 39 Å was observed on was observed on the x-ray diffraction pattern. The orientation parameter S of 0.38 was obtained for the parallel orientation of wide angle diffraction. Perpendicular orientation to the electrode surface could not be obtained, even though LCM-2 had a negative dipole anisotropy, because of the long thermal curing time for the epoxy/amine system.

Having described the invention, it is to be noted that various applications and embodiments not specifically exemplified are possible within the spirit and scope of the invention.

What is claimed as new and is desired to be secured by Letters Patent of the United States is:

1. A process for producing a patterned anisotropic polymeric film comprising the steps of:
    (1) orienting a film comprising a photopolymerizable liquid crystalline monomer having a negative dipole anisotropy in an ac electric field,
    (2) irradiating said film in a pattern-wise manner to polymerize said monomer while maintaining said monomers in a liquid crystalline state.

2. The method of claim 1, wherein said film comprises polymerized monomer oriented in two different orientations such that said film comprises two distinct regions of differing molecular orientation, said two different orientations provided by changing the frequency of the ac electric field.

3. The process of claim 2, wherein one of said distinct regions comprises orientation parallel to said electric field and another of said distinct regions comprises orientation perpendicular to said electric field.

4. The processes claimed in claim 1, wherein said liquid crystalline monomer is a monomer selected from the following monomers:

Fn-Sp-M-Sp-Fn,
Fn-M-Fn, and
Fn-M-Sp-M-Fn,
wherein M is selected from

M:

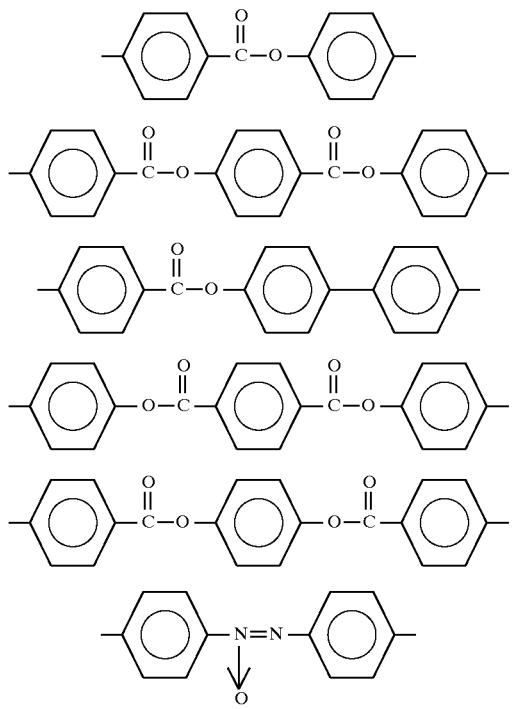

where Fn is

Fn:

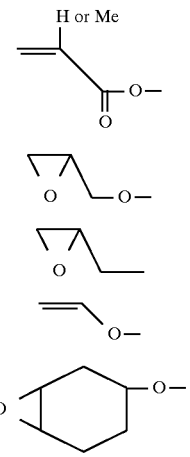

and wherein Sp is a spacer selected from alkyl groups, alkyloxy groups, oligoethyloxy groups, oligoisopropyloxy groups and oligodimethylsiloxanes.

5. The process of claim 4, wherein said monomer has the formula Fn-Sp-M-Sp-Fn.

6. The process of claim 4, wherein said monomer has the formula Fn-M-Fn.

7. The process of claim 4, wherein said monomer has the formula Fn-M-Sp-M-Fn.

8. The process according to claim 1, wherein said monomer selected from the group consisting of 4-[[6-[(1-oxo-2- propenyl)oxy]hexyl]oxy]benzoic acid, 4-[[4-[[6-[(1-oxo-2-propenyl) oxy]hexyl]oxy]phenoxy]carbonyl]phenyl, 4-[[6-[(1-oxo-2-propenyl) oxy]hexyl]oxy]benzoic acid 1,4-phenylene ester, and 1,4-benzenedicarboxylic acid bis[4-[[6-[(1-oxo-2-propenyl) oxy]hexyl]oxy]phenyl] ester, 4-[2-(oxranylmethoxy) ethoxy]benzoic acid 1,4-phenylene ester, 4-(oxiranylmethoxy)benzoic acid 1,9-noanediylbis(oxy-4,1-phenylene) ester, and 4-[[6-(ethenyloxy)hexyl]oxy]benzoic acid 1,4-phenlene ester.

* * * * *